United States Patent [19]

Paivinen et al.

[11] 4,074,301
[45] Feb. 14, 1978

[54] FIELD INVERSION CONTROL FOR N-CHANNEL DEVICE INTEGRATED CIRCUITS

[75] Inventors: John O. Paivinen, Newtown Square; Walter D. Eisenhower, Audubon, both of Pa.

[73] Assignee: MOS Technology, Inc., Norristown, Pa.

[21] Appl. No.: 737,547

[22] Filed: Nov. 1, 1976

Related U.S. Application Data

[62] Division of Ser. No. 613,537, Sept. 15, 1975, Pat. No. 4,011,105.

[51] Int. Cl.² ........................................... H01L 29/78
[52] U.S. Cl. .................................. 357/23; 357/91; 148/1.5; 148/187
[58] Field of Search ............... 357/23, 91; 148/1.5, 148/187

[56] References Cited

U.S. PATENT DOCUMENTS

| 3,472,712 | 10/1969 | Bower | 148/1.5 |
|---|---|---|---|
| 3,650,019 | 3/1972 | Robinson | 148/1.5 |
| 3,653,978 | 4/1972 | Robinson et al. | 357/91 |
| 3,728,161 | 4/1973 | Moline | 357/91 |
| 3,745,425 | 7/1973 | Beale et al. | 357/23 |
| 3,751,722 | 8/1973 | Richman | 357/23 |
| 3,752,711 | 8/1973 | Kooi et al. | 357/23 |
| 3,764,413 | 10/1973 | Kakizaki et al. | 357/23 |
| 3,775,191 | 11/1973 | McQuhae | 148/1.5 |
| 3,853,633 | 12/1974 | Armstrong | 357/91 |
| 3,867,204 | 2/1975 | Rutledge | 357/23 |
| 3,891,468 | 6/1975 | Ito et al. | 148/1.5 |
| 3,898,105 | 8/1975 | Mai et al. | 148/1.5 |
| 3,948,694 | 4/1976 | Mills | 357/91 |
| 3,983,572 | 9/1976 | Johnson | 357/23 |
| 3,983,620 | 10/1976 | Spadea | 357/91 |
| 4,006,491 | 2/1977 | Alaspa et al. | 357/23 |
| 4,011,581 | 3/1977 | Kubo et al. | 357/23 |

Primary Examiner—Andrew J. James
Attorney, Agent, or Firm—Cooper, Dunham, Clark, Griffin & Moran

[57] ABSTRACT

The field inversion properties of integrated circuits incorporating N-channel MOS devices are improved by using a silicon substrate whose bulk dopant concentration is low, but whose local dopant concentration is high at the field surfaces under the field oxide separating the active surface areas where the individual N-channel MOS devices are formed. The differential doping between surface areas under the field oxide and the active surface areas of the substrate is done by nonselectively ion-implanting boron into the substrate to form a uniform low resistivity layer, removing selected portions of the low resistivity layer to expose the unimplanted, high resistivity substrate and forming the active devices at the unimplanted substrate portions. As an option, the unimplanted surface portion can be doped to an intermediate dopant concentration to improve performance. The remaining pattern of the low resistivity layer is covered with field oxide. The invention allows the use of relatively inexpensive, low dopant concentration substrates to conveniently manufacture high performance N-channel MOS integrated circuits.

8 Claims, 16 Drawing Figures

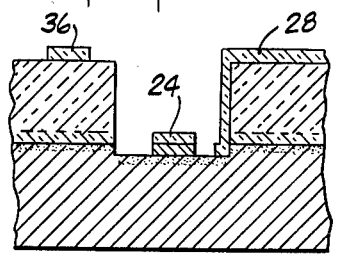
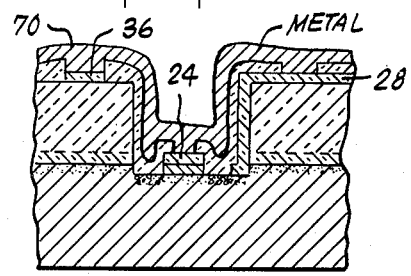
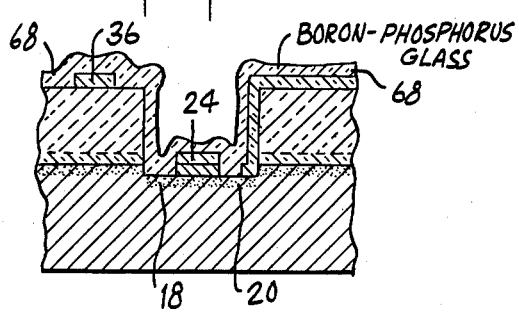
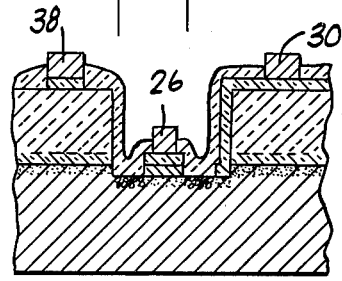
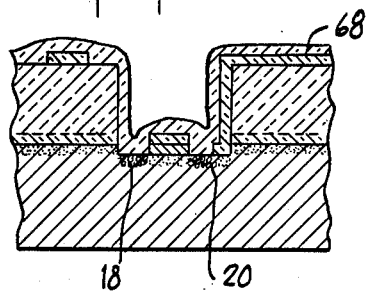
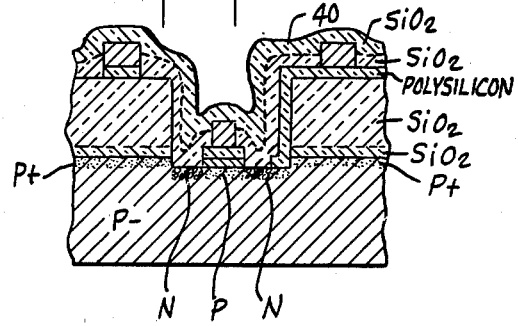
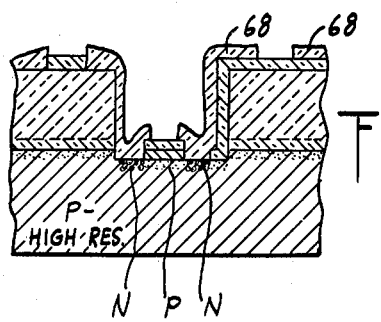

FIELD INVERSION CONTROL FOR N-CHANNEL DEVICE INTEGRATED CIRCUITS

This is a division of application Ser. No. 613,537 filed Sept. 15, 1975 now U.S. Pat. No. 4,011,105, issued Mar. 8, 1977.

BACKGROUND OF THE INVENTION

The invention is in the field of semiconductor devices in general and integrated circuit semiconductor devices in particular, and relates specifically to field inversion control for such devices.

In MOS integrated circuits, each individual MOS transistor is surrounded by a thick oxide area formed over the same surface of the substrate. This thick oxide area is called the field oxide, or simply the field. The electrical leads interconnecting the individual MOS transistors pass over this field oxide. If the voltage level of such interconnects with respect to the substrate is sufficiently high, a conducting channel may be formed where none is intended, e.g., a conducting channel between two adjacent MOS transistors which are meant to operate independently. The resulting parasitic transistor is called a field inversion transistor, and the process is called field inversion.

Field inversion is a particularly severe problem in N-channel MOS devices because the ratio between the threshold voltage causing undesirable field inversion and the threshold voltage causing the desirable inversion under the gate of a transistor is typically considerably lower than for p-channel devices. Various techniques have been used in the past in an effort to combat the field inversion problem in N-channel device. For example, the thickness of the field oxide has been increased as compared to the thickness of the gate oxide so as to raise the ratio between the field and gate threshold voltages. However, there are processing and cost limitations on how thick the field oxide can be made. The likihood of field inversion can also be reduced by lowering the gate voltage, but this decreases the performance of the device. It is also known that if the doping concentration of the substrate under the field oxide is sufficiently high, e.g., corresponding to less than 1 ohm centimeter resistivity, the field inversion properties of the resulting device would be adequate. In practice, however, the bulk substrate doping level can not be chosen this high because of body effect and mobility reduction, which result in degraded performance.

Based on knowing that high dopant concentration under the field oxide is desirable, it has been proposed to selectively dope the substrate, i.e., to have the bulk of the substrate at relatively low doping concentration and the portions of the substrate immediately below the field oxide at relatively high dopant concentration. One way to achieve selective doping of this type is by highly accurate ion-implantation. There is, however, one serious problem with such ion-implantation: in order to selectively ion-implant, it is necessary to mask the region where the implant is not wanted with a mask of photoresist, oxide or metal delineated with the desired pattern, and — when the mask is removed — it becomes very difficult to align the implant regions with the mask used in subsequent photomasking steps. It therefore becomes necessary to use extra masks merely for the purpose of providing registration marks. Another technique for selective doping for field inversion control is discussed in U.S. Pat. No. 3,751,722 and involves silicon nitride masking. It is well known, however, that processes using silicon nitride masking steps are less reliable and more difficult than processes using, for example, only silicon oxide masking. Thus, while it is known that selective doping can be useful for field inversion control, there is still a need for providing selective doping by a reliable and more practical process.

SUMMARY OF THE INVENTION

The invention is in the field of semiconductor and integrated circuit structures and is specifically directed to field inversion control for such structures.

In accordance with the invention, field inversion control is accomplished by differentially doping a laterally extending major surface of a semiconductor substrate so that the substrate layer portions under the field oxide of an integrated circuit formed on said surface of the substrate can have higher dopant concentration than the remainder of the substrate. The differential doping in accordance with the invention is carried out by forming, along a laterally extending major surface of a substrate, a laterally uniform layer whose dopant concentration is higher than that of the substrate, removing selected area portions of the layer to leave remaining along the substrate surface a pattern of layer portions separated from each other by areas of substrate material, and forming integrated circuit components at the substrate areas such that they are spaced from each other by fields formed by the remaining portions of the layer which has higher dopant concentration than the substrate.

A major advantage of the invention, as compared to differential doping by using nitride masking, is that only silicon dioxide masking is used, and there is no need to face the process difficulties associated with nitride masking. A major advantage of the invention, as compared to differential doping by ion-implanting only selected areas of a substrate surface, is that there are no difficulties in aligning subsequent masks to the doped fields, and that no extra masking steps are necessary. In accordance with the invention, it is possible to make N-channel MOS integrated circuits of high speed and complexity with a minimum number of processing steps. Moreover, each processing step uses reliable and proven technology. The devices made in accordance with the invention are high density, low threshold circuits with high field inversion and excellent stability to temperature bias treatment.

In a more specific embodiment of the invention, a selected dopant is ion-implanted uniformly into a laterally extending major surface of a semiconductor material substrate of a selected conductivity type and selected resistivity, to form along that surface a laterally uniform semiconductor material layer which is of the same conductivity type as the substrate but of lower resistivity. Selected area portions of the lower resistivity layer are removed to leave remaining along the substrate surface a pattern of layer portions separated from each other of unimplanted substrate material areas. Integrated circuit components are formed at the unimplanted substrate areas, and are spaced from each other by fields of the remaining lower resistivity layer material. In the more specific example of making N-channel MOS integrated circuits, the substrate is P-material, and the dopant which is ion-implanted is a P-type dopant and forms a uniform surface layer of P-material of higher dopant concentration than the remainder of the substrate.

Still more specifically, the invention is applied to making N-channel MOS integrated circuit structures by starting with a substrate of a P⁻-type semiconductor material, i.e., material of relatively high resistivity, for example 10-25 ohm centimeters, and ion-implanting a P-type dopant to form a layer of P⁺-type semiconductor material which is uniform along the implant surface of the substrate. A thick oxide layer is deposited overall and is photolithographically patterned and etched to expose the substrate areas which will be the active areas, e.g., the areas for the source, drain and gate of each MOS device. At this point the implanted layer is etched at the active areas to remove the implanted layer, a gate oxide is grown, and a second ion-implantation of P-type dopant is carried out to set the depletion level at selected active areas. The second implant creates P-type regions on a P⁻-type substrate, with the P-regions separated by P⁺-regions. An additional, optional masking step can be used, along with an N-type implantation, at selected ones of the active areas to make some depletion-type devices instead of enchancement type devices. The resulting structure can be further processed to form conventional metal gate devices, or to form self-aligned gate devices using polysilicon or refractory metals.

While dopants can be ion-implanted directly into the active areas of a semiconductor substrate surface, this typically requires that the angle between the ion beam and the implantation surface be controlled carefully to prevent alignment between the ion beam and the crystal structure of the substrate and to ensure implantation to a reasonably uniform depth. In accordance with the invention ion-implantation is through a thin layer of oxide rather than directly into the substrate. The passage of the ion beam through the oxide diffuses the beam sufficiently to allow implantation to a uniform depth, even when the angle between the beam and the implantation surface is not carefully controlled. Accordingly, accurate and uniform ion implantation can be carried out in this invention with less accurate implantation devices and at a higher speed.

BRIEF DESCRIPTION OF THE DRAWINGS

FIGS. 2-16 are sections illustrating steps in the process of making the structure shown in FIG. 1.

DETAILED DESCRIPTION

The invention is described in detail below as applied to field inversion control in N-channel MOS integrated circuit structures. It should be clear, however, that the invention is applicable to other processes and devices where field inversion is a problem and can be controlled by differential doping.

Figure 1:
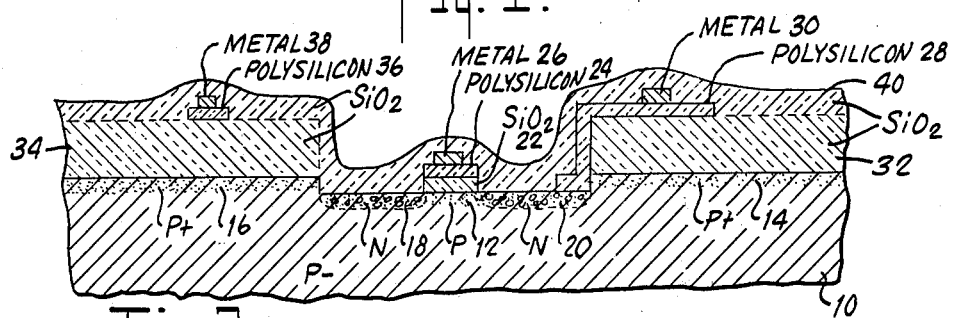
FIG. 1 is a section through a portion of an integrated circuit made in accordance with the invention.

In order to show a typical environment to which this invention is applicable, FIG. 1 shows an examplary portion of an integrated circuit structure made in accordance with the invention. The shown portion includes an N-channel MOS enhancement device flanked laterally by fields which are doped differentially for field inversion control. FIG. 1 shows only a broken-off portion of a larger integrated circuit, and it should be clear that other MOS devices, including depletion devices, or other integrated circuit components, such as other active or passive devices, may be disposed along the same surface of the substrate to form an integrated circuit structure.

In FIG. 1 the substrate 10 is a P⁻-material, the channel region 12 of the shown MOS device is P-type material, and the fields 14 and 16 are P⁺-type material. The notation P⁻, P and P⁺ is used to designate the difference in the dopant concentration levels between the substrate, channel region and fields in the shown structure, rather than absolute dopant concentration levels. While the absolute levels can be any levels suitable for the intended use of the integrated circuit structure, what is important in this invention is that the dopant concentration of the substrate 10 be lower than that of the channel region 12 and the fields 14 and 16, and the dopant concentration of the fields 14 and 16 be higher than that of the substrate 10 and the channel region 12. It should be clear that in some cases the only important characteristic may be to have the fields more doped than the bulk substrate, while in other cases it may only be important to have the fields more doped than the channel region.

The shown MOS device includes source and drain regions 18 and 20, which are N-type material, a gate oxide 22 over the channel region 12 and a polysilicon layer 24 overlaying the gate oxide 22, and a metal interconnect 26 in electrical contact with the polysilicon layer 24. Electrical contact to the drain region 20 is through a polysilicon layer 28 and a metal interconnect 30. The electrical contact to the source region 18 is not shown in the section represented by FIG. 1. The fields 14 and 16 of the substrate 10 are overlayed with relatively thick field oxide layers 32 and 34, respectively, and an interconnect comprising a polysilicon layer 36 and a metal layer 38 is shown over the oxide layer 34. The interconnect comprising the layers 36 and 38 is for other portions of the integrated circuit. A passivating oxide layer 40 covers the entire structure. Field inversion results when the potential at interconnects, such as the polysilicon layers 28 and 36, with respect to the potential of the substrate 10 is sufficient to form a conducting channel between the MOS device shown in FIG. 1 and other integrated circuit components that may be on the same substrate. Where such conducting channel is not intended, it is clear that such parasitic conduction would significantly degrade the performance of the integrated circuit and would be highly undesirable. However, when the dopant concentration at the fields 14 and 16 is sufficiently high, e.g., sufficiently high so that the resistivity of the substrate fields 14 and 16 is of the order of 1 or 2 ohm-cm, the threshold voltage at which field inversion occurs is sufficiently higher than the threshold voltage for the operation of the circuit components, and no field inversion occurs in normal operation of the integrated circuit.

The process for making an integrated circuit with field inversion control in accordance with the invention is illustrated in FIGS. 2-16. The starting material is a ,100. silicon wafer substrate whose dopant concentration is relatively low (and resistivity is relatively high). In the example of making N-channel MOS integrated circuit structures, the starting material is P-type silicon whose resistivity is of the order of 10-25 ohm-cm. It is designated in the figures as P⁻-material; however, this is intended only to designate its dopant concentration in comparison to the dopant concentration of other P material portions of the resulting integrated circuit and not as a designation of absolute dopant level. After conventional preparation, the substrate 10 is oxidized thermally to grow a silicon dioxide layer 41, which is about 1000 A thick and is substantially uniform throughout the top face of the substrate 10. A P-type dopant, such as boron, is ion-implanted into the top face of the substrate 10 through the oxide layer 41. The ion-implantation is to a total depth of about 2000 A, of which the oxide is about 1000 A and 1000 A is into the substrate 10, and forms a P+ layer 42 whose dopant concentration is considerably higher than that of the substrate 10, e.g., the dopant concentration is sufficient for the resistivity of the layer 42 to be of the order of 1 or 2 ohm-cm. The substrate fields, such as the fields 14 and 16 in FIG. 1, are subsequently formed of portions of this P+ layer 42.

Note that the beam 44 of boron ions can be perpendicular, or nearly so, to the top face of the substrate 10 and still give penetration into the substrate 10 to a uniform depth. This is distinguished from the typical prior art ion-implantation into exposed substrate material which must be at a carefully controlled angle to the exposed surface, e.g., a typical angle of about 7° with respect to a line normal to the implanted surface, to avoid alignment of the beam with the crystal structure which may result in some ions striking a line of crystal atoms and not going deep enough while other ions strike the interstitial space and go in too deep. By ion-implanting through the oxide layer 41 in accordance with the invention, uniform penetration depth is ensured because the oxide diffuses the ion beam 44 sufficiently to prevent undesirable alignment of the penetrating ions with the crystal structure of the substrate 10. Because of this ion-implantation through the oxide layer 41, it is possible in the invention to ion-implant without carefully controlling the angle between the beam 44 and the substrate 10.

Figure 2:
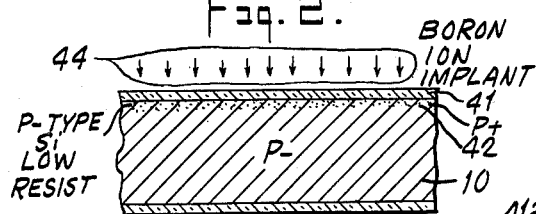

After the P+ layer 42 has been implanted as shown in FIG. 2, a uniform silicon dioxide layer which is about 14,000 A thick is deposited over the thin oxide layer 41 by the Silox process at about 400° C. Note that the Silox deposition is at a relatively low temperature to avoid disturbing the P+-type layer 42 and driving in the dopant. A photoresist pattern is deposited over the top surface of the thick oxide layer, and an opening is defined in the photoresist pattern to define the location of each integrated circuit component to be formed at the substrate. The silicon dioxide exposed through the windows of the photoresist mask is etched down to the top surface of the substrate 10, to form a structure of the type shown in FIG. 3, where the thin oxide layers 41a and 41b are the unetched portions of the oxide layer 41 in FIG. 2, the thick oxide layers 46 and 48 are the unetched portions of the 14,000 A thick, uniform oxide layer, and a window 50 is open to expose the P+-type layer 42.

Figure 4:
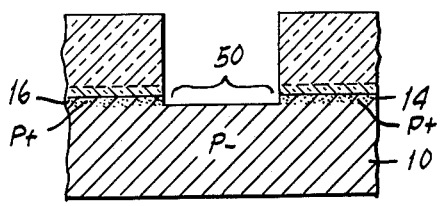
Figure 8:
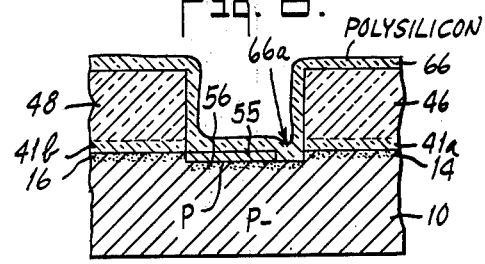
Figure 5:
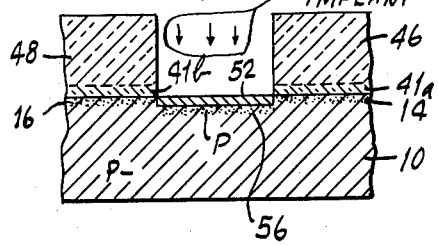

The portion of the P+-layer 42 exposed through the window 50 is etched away down to the P−-substrate 10, to form a structure of the type illustrated in FIG. 4, and then a thin oxide layer 52 (about 1000 A thick) is grown over the unimplanted portion of the substrate 10 exposed through the window 50, to form a structure of the type illustrated in FIG. 5. Note that the removal of the portion of the P+ layer 42 through the window 50 leaves portions of the layer 42 which form the P+ substrate fields 14 and 16 shown in FIG. 1. A P-type material, such as boron, is then ion-implanted through the thin oxide layer 52, to form a P-type layer 56 which is about 1000 A thick, the same as the P+-type layers 14 and 16, but is recessed by about 1000 A into the substrate 10. The dopant concentration of the P-layer 56 is about one-fifth that of the P+-layers 14 and 16, but is greater than that of the P+-substrate 10. A portion of the layer 56 will be used later to form the channel region 12 illustrated in FIG. 1. Note that the ion beam 54 again passes through the thin oxide layer 52, just as the ion beam 44 passed through the thin oxide layer 41.

Figure 6:
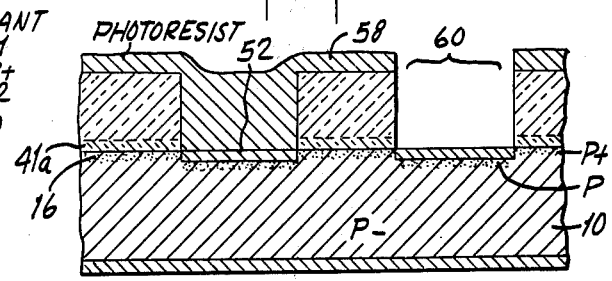
Figure 3:
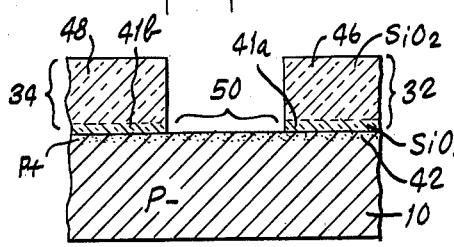
Figure 7:
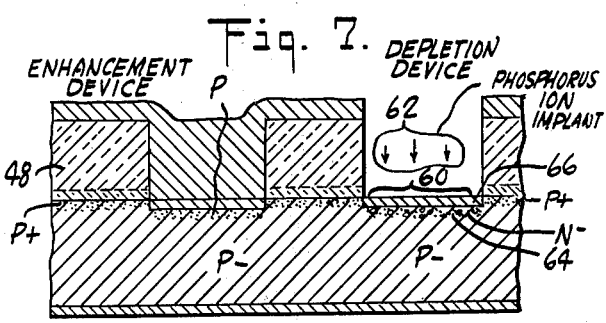

Up to this time the active areas of the substrate for depletion and enhancement devices have been processed in the same manner. In order to provide the additional doping necessary for depletion devices, those active substrate areas which will be used for depletion devices are covered with a photoresist layer 58 as illustrated in FIG. 6 through suitable masking, while a window 60 is left at each active area to be used for a depletion device. An N-type dopant, such as phosphorous, is then ion-implanted through the window 60 to form a doped layer 64 of the type necessary for a depletion device. Note that the ion beam 62 can again be perpendicular to the substrate and its angle need not be carefully controlled because the ion-implantation is through a thin oxide layer 66. Since enhancement devices differ from depletion devices only in the type of doping, only enhancement devices will be discussed below, with the understanding that depletion devices are made in accordance with the invention in the same manner except for the use of different doping materials.

Figure 9:
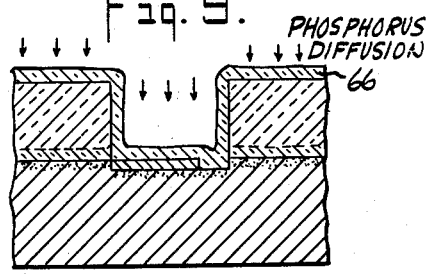

After the area for an enhancement device is prepared to form a structure of the type illustrated in FIG. 5, a contact hole is opened through the oxide layer 52 by conventional masking and etching, and a polysilicon layer 66 is deposited over the entire structure by a low temperature deposition process so as not to disturb or drive in the doping. The polysilicon contacts the P-layer 56 at the area 66a, where a contact window has been previously opened through the oxide layer 52, to thereby provide electrical contact to a drain region to be formed subsequently. Similar electrical contact is formed to a source region to be formed subsequently but is not visible in the sectional view illustrated in the figures. A dopant, such as phosphorous, is then diffused as shown in FIG. 9 into the polysilicon layer 66 to make it more conductive, as is conventional in the art of making integrated circuit structures. After suitable masking and etching, the polysilicon layer 66 is removed except for contact layer portions for the source, gate and drain parts of the MOS device, as illustrated at FIG. 10, where the reference numerals correspond to the numerals used in FIG. 1. Specifically the polysilicon layer portion 28 provides an interconnect to the drain area of the device to be made, the polysilicon portion 24 provides electrical contact for the gate, and the polysilicon portion 36 is for an interconnect to the source at an area which is not visible in FIG. 10.

A phospho-boro-silicate glass is then deposited over the entire device to form a structure of the type illustrated in FIG. 11. The glass is formed by pyrolitic deposition at a temperature range of 350°–450° C using a gas phase mixture centered at about 1 part by volume boron hydride ($B_2H_6$), 4.6 parts by volume phosphorous hydride ($PH_3$), 22.1 parts by volume silicon hydride ($SiH_4$) and 634 parts by volume oxygen ($O_2$). The glass layer 68 shown in FIG. 11, can be a source of an N-type dopant for diffusion-doping of the source and drain regions of the MOS device. Note that, as illustrated in FIG. 11, the glass is bulbous at the edges of the polysilicon layers 24, 28 and 36, which is an effect inherent in the pyrolitic deposition of such glass. The glass layer 68 is kept at about 1000°–1100° C for about 20 minutes to drive the doping from the glass layer 68 into the exposed source and drain regions 18 and 20, respectively. In addition to driving in the dopant, the heat reflows the glass and removes the irregularities or bulbs at the edges of the polysilicon, and increases the conductivity of the polysilicon. Contact holes are then cut through the glass layer 68 by masking and etching to form a structure of the type illustrated in FIG. 13. While the etch rate of phosphorous glass (without boron) is very high, which can complicate the etching process, the addition of boron to the glass layer 68 as described above makes the glass etch-rate comparable to that of undoped silicon dioxide while retaining the desirable reflow characteristics of the glass layer 68. The glass layer 68 can therefore be etched by the same reliable techniques which have been developed for undoped oxide.

A metal blanket 70 is vacuum deposited over the top of the entire structure, as shown in FIG. 14, to provide electrical contact to the polysilicon portions exposed by the etched parts of the glass layer 68. The metal blanket 70 is pre-sintered for about 5 minutes at about 400° C in forming gas (10% hydrogen and 90% nitrogen) to provide better metallurgical bonding between the metal 70 and the polysilicon portions 24, 28 and 36. The metal blanket 70 is then removed by conventional masking and etching except for the portions 26, 30 and 38 shown in FIG. 15, which are the electrical interconnects to the source, drain and gate of the illustrated MOS device. A passivating silicon dioxide layer 40, which is about 8000 A thick, is then deposited over the entire device by the Silox process referred to above at a low temperature, to avoid disturbing the doping, to form a device of the type illustrated in FIG. 16, and in FIG. 1. As discussed above, the devices shown in FIGS. 1 and 16 are only portions of larger integrated circuit structures which include other devices of the illustrated type, perhaps depletion devices as well, and perhaps other active and passive integrated circuit components as well. As a last step, suitable holes are cut around the edges of the integrated circuit structure through the oxide layer 40 for the purpose of connecting pads for external contact to selected metal interconnects, and the resulting device is encapsulated.

We claim:

1. An N-channel MOS integrated circuit structure comprising:
   a single crystal semiconductor material substrate of $P^-$-type bulk conductivity material having a laterally extending top flat surface;
   said substrate being ion-implanted along said top surface with a P-type dopant to form a top, $P^+$-type field layer, the resistivity of said $P^+$-type field layer being substantially less than that of the underlying $P^-$-type material;
   selected portions of said $P^+$-type field layer being removed at locations which are laterally spaced from each other to leave a pattern of field layer areas, and the $P^-$-type material which is exposed thereby and is laterally surrounded by said field areas being ion-implanted with a P-type dopant to form top, P-type layers, the resistivity of said P-type layers being intermediate that of the $P^-$-type material and the material of the $P^+$-type field layer;
   selected portions of at least some of said P-type layers being doped with N-type material to form N-channel MOS devices;
   layers of material electrically inert as compared with said $P^+$-type material being disposed over the field areas; and
   electrical interconnects extending over at least some of said layers of inert material and making electrical contact with at least some of said MOS devices.

2. A structure as in claim 1 wherein said ion-implanted layers of $P^+$-type and P-type material are of the order of 1,000 A thick.

3. An integrated circuit structure having N-channel MOS devices disposed along a laterally extending major surface of a high bulk resistivity $P^-$-type substrate and laterally spaced from each other by low resistivity $P^+$-type surface field areas of said substrate for field inversion control comprising:
   a high bulk resistivity $P^-$-type material substrate and P-type dopant ion-implanted into a laterally extending major surface of said high resistivity $P^-$-type material substrate to form a laterally uniform layer of low resistivity $P^+$-type material extending along said major surface of the substrate;
   selected portions of said layer being removed to form a pattern of active areas of unimplanted substrate surface areas laterally spaced apart by a pattern of remaining low resistivity layer portions; and
   N-channel MOS devices formed at least at selected ones of said active areas of the substrate, said devices being laterally spaced from each other by field areas formed by said remaining portions of the layer of low resistivity $P^+$-type material;
   the top surfaces of said active areas being depressed relative to the top surfaces of said field areas;
   a layer of a material which is substantially inert as compared to the low resistivity P-type material, said inert material layer disposed over said remaining low resistivity layer portions; and
   electrical interconnects extending over at least portions of said inert layer and making electrical contact with at least some of said MOS devices.

4. A structure as in claim 3 including P-type dopant ion-implanted at said active areas to form layers of P-type material the resistivity of which is intermediate that of the high resistivity $P^-$-type material and the low resistivity $P^+$-type material.

5. A structure as in claim 4 wherein the layers of low resistivity and intermediate resistivity materials are of the order of 1,000 A thick.

6. An integrated circuit structure comprising:
   a single crystal semiconductor material substrate having a laterally extending top major surface which has laterally alternating field areas and active areas, the active areas being depressed into the substrate relative to the field areas;
   said substrate having at the field areas a top layer which is thin relative to the thickness of the substrate, said top layer having the same conductivity type as the underlying substrate material but being ion-implanted with a doping agent causing the layer to have substantially lower resistivity than that of the underlying substrate material;
   an oxide layer over the field areas;
   circuit components formed at the active areas of the substrate; and
   electrical interconnects to said circuit components extending at least partly over said oxide layer.

7. A structure as in claim 6 wherein said lower resistivity layer is of the order of 1,000 A thick and the active areas are depressed into the substrate relative to the field areas by a distance of the order of 1,000 A.

8. A structure as in claim 7 wherein at least portions of said active areas are ion-implanted with the same type doping agent as the field areas to cause said portions of the active areas to have resistivity which is intermediate that of the lower resistivity layer and the bulk resistivity of the material underlying said lower resistivity layer, said intermediate resistivity layer being of the order of 1,000 A thick.

* * * * *